United States Patent [19]
Llor

[11] Patent Number: 5,159,271
[45] Date of Patent: Oct. 27, 1992

[54] TURBINE HAVING A ROTOR FORMING A NUTATION AND PRECESSION MOVEMENT

[75] Inventor: Antoine Llor, Boulogne, France
[73] Assignee: Commissariat a L'Energie Atomique, France
[21] Appl. No.: 557,524
[22] Filed: Jul. 24, 1990

[30] Foreign Application Priority Data

Jul. 24, 1989 [FR] France .................. 89 09937

[51] Int. Cl.⁵ .................................................. G01V 3/00
[52] U.S. Cl. ......................................... 324/321; 324/318
[58] Field of Search .............. 324/321, 318, 322, 308, 324/313; 128/653 SC; 415/70, 63

[56] References Cited

U.S. PATENT DOCUMENTS

| | | | |
|---|---|---|---|
| 3,588,677 | 6/2971 | Kleiman et al. | 324/321 |
| 4,510,450 | 4/1985 | Brown | 324/321 |
| 4,899,111 | 2/1990 | Pines et al. | 324/321 |

OTHER PUBLICATIONS

Molecular Physics, 1988, vol. 65, No. 4, pp. 1013-1018.
"Double Rotor for solid-state NMR" by A. Samoson et al. Rev. Sci. Instrum. 60(10) Oct. 1989 pp. 3239-3241.

*Primary Examiner*—Louis Arana
*Attorney, Agent, or Firm*—Hayes, Soloway, Hennessey & Hage

[57] ABSTRACT

Turbine for the analysis of samples by nuclear magnetic resonance. It comprises a rotor (7) having a spherical central core (8), whereof a cavity (9) contains the solid sample to be analyzed. Two conical surfaces are provided on either side of the central core (8) for rolling on two conical surfaces (13) of the stator. Blades are driven by a flow of compressed gas. This arrangement makes it possible to move the rotor (7) very rapidly, while respecting a constant ratio of the nutation and precession rotation speeds.

10 Claims, 3 Drawing Sheets

TURBINE HAVING A ROTOR FORMING A NUTATION AND PRECESSION MOVEMENT

DESCRIPTION

The present invention relates to a turbine, whose rotor performs a double nutation and precession movement and which is normally used for analysing solid samples and in particular pulverulent samples by nuclear magnetic resonance.

This analysis method has been widely used for a number of years for the spectroscopy analysis of liquid samples, but it is more difficult to use for solid samples, because the absence of any Brownian motion is prejudicial to the quality of the results.

The idea of simulating a Brownian motion by enclosing the solid sample in the rotor of a turbine subject to a fast rotary movement has already been mentioned. The rotor is arranged in a volume surrounded by a reception coil for the measurement signals. However, said method is not entirely satisfactory, because it is only effective for cores with a spin equal to $\frac{1}{2}$, whereas it is often preferable to have good quality information on cores with a spin of a higher number such as $^{17}O$, $^{23}Na$, $^{27}Al$, etc. However, even in the case of spin cores equal to $\frac{1}{2}$, the heterogeneities of the magnetic permittivity e.g. due to the gaps between the grains in the powder of the sample limit the expected resolution.

An improvement to this process has been proposed by rotating the rotor according to a double nutation and precession movement. The rotor rotates on itself about a nutation axis, which is rotated in accordance with a precession movement, so as to describe a cone having a fixed axis. The rotation speed of the precession movement is designated $\omega_1$ and that of the nutation movement $\omega_2$, whilst $\theta_1$ is the angle between the direction of the magnetic field and the fixed axis and $\theta_2$ the cone semi-angle. The theoretical conditions to be satisfied by practical constructions have been given. Thus, the angle $\theta_1$ and $\theta_2$ must be chosen from the following four pairs of values:

$\theta_1 = 54.74°, \theta_2 = 30.56°$;
$\theta_1 = 54.74°, \theta_2 = 70.12°$;
$\theta_1 = 30.56°, \theta_2 = 54.74°$; and finally
$\theta_1 = 70.12°, \theta_2 = 54.74°$.

The first solution is preferable, because it implies a minimum precession angle and thus simplifies construction. The precession speed $\omega_1$ and nutation speed $\omega_2$ must be commensurate to approximately $10^{-3}$, but in a ratio differing from 4, 3, 2, 3/2, 4/3, 1 or their inverse functions. However, their largest common divider must be higher than the magnetic interaction to be eliminated, so that ratios are chosen of e.g. 5, 5/2, 5/3, 5/4 and their inverse functions, the ratio of the speeds being preferably close to unity.

Finally, the rotation speed of the rotor must be several kilohertz in order to eliminate the magnetic interaction and conductive materials must not be used in the vicinity of the reception coil.

Thus, the preliminary communication in Molecular Physics, 1988, vol.65, No.4, pp.1013 to 1018 by Samoson, Lippmaa and Pines, very diagrammatically describes a double rotor turbine in which the rotor containing the sample rotates in an outer rotor of a much larger size and the rotation axes of the two rotors are spaced by the precession angle.

This solution suffers from several disadvantages. In particular, the dynamic balancing of the assembly is difficult to obtain and it is also difficult to supply the gas making it possible to drive the internal rotor. It is also difficult to respect an admissible ratio between the nutation and precession speeds, because the drives of the two rotors use two independent gas circuits and it is not easy to measure the rotation speed of the internal rotor. Finally, the filling factor, i.e. the ratio between the volume of the sample to be analysed and the volume surrounded by the reception coil is very small because the ratio $\omega_2/\omega_1$ is 5 and the dynamic balancing of the rotor, in these conditions, gives a very long chamber (length to diameter ratio of approximately 3).

SUMMARY OF THE INVENTION

The invention provides a solution making it possible to obviate these disadvantages and relates to a simply operating turbine calling on no complicated technical elements.

It comprises a stator, a rotor provided with driving notches or blades and located on fluid bearings within the stator, gas blowing systems for supplying the bearings and driving the blades and the rotor in order to make the latter roll, without sliding, on the stator. There is a single rotor, which is subject to both the nutation and the precession movements. It comprises a central core, generally limited by concentric spherical portions, provided with a cavity containing the sample to be analysed and two generally conical, coaxial rolling surfaces extending on either side of the core and with apices coinciding with the centre of the core. The stator comprises two generally conical bearing surfaces on which the rotor rolls by its rolling surfaces. The cones defining these bearing surfaces have the same axis forming an acute angle with the axis of the rolling surfaces. In this case the core has a surface constituted by at least one spherical portion and a spherical portion is certainly associated with each bearing.

The core can either be provided with concavities defined by the rolling surfaces, or can carry two generally conical rollers, whereof a wall constitutes a rolling surface. The blades or notches are then located on the rollers, particularly at their end opposite to the core.

The core can be perfectly spherical, or can e.g. be formed by two spherical cups, to which are respectively connected the two rollers, as well as a truncated sphere between the two cups. This solution can be used where the bearings are formed by an annular bearing with blowing orifices distributed over a circumference of the stator between the bearing surfaces and a thrust bearing constituted by two blowing orifices each located along the axis of one of the bearing surfaces. The cavity can be cylindrical and its axis can coincide with the axis of the rollers.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

Figure 1:
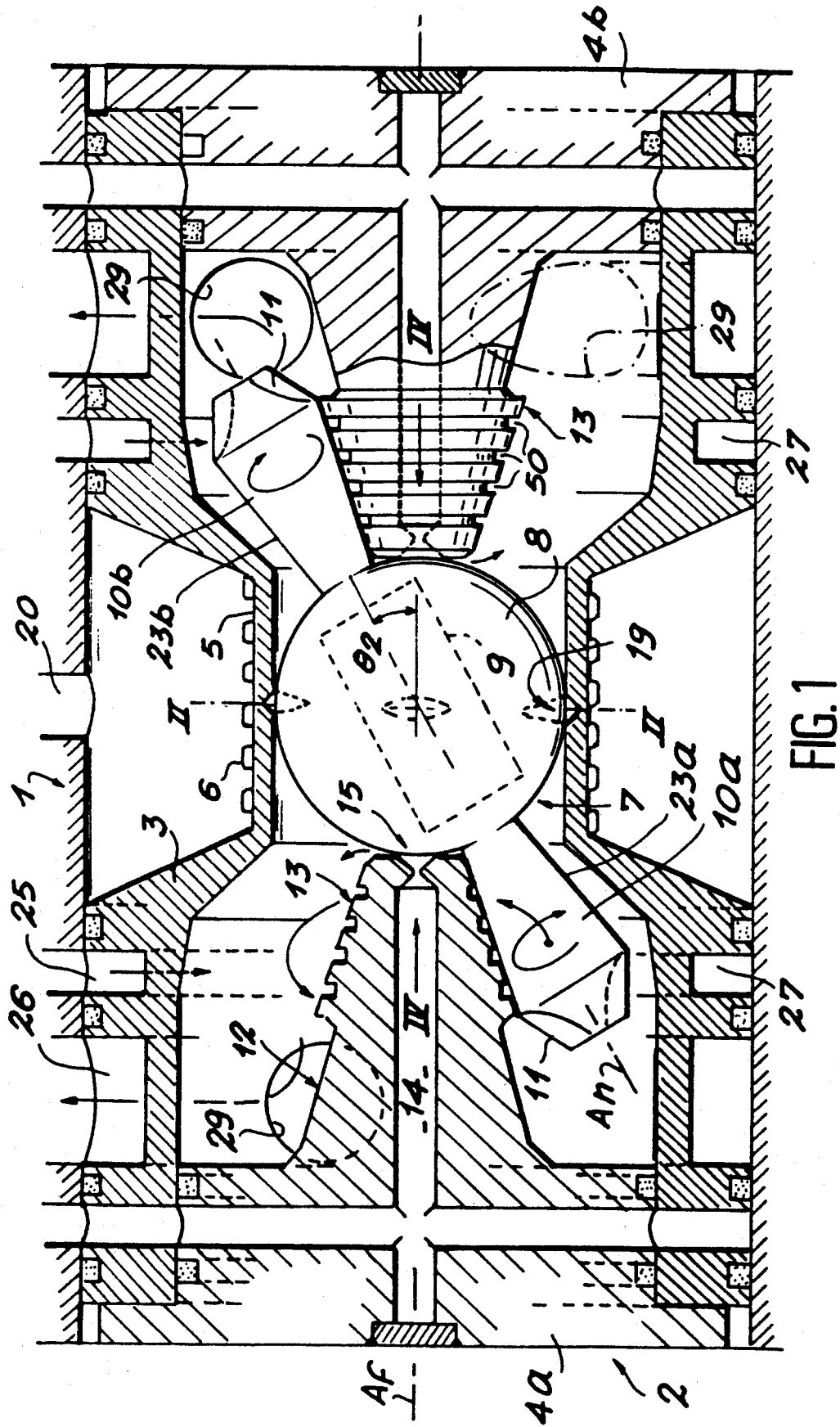
FIG. 1 a diametral section of the turbine.

It can be seen in FIG. 1 that the turbine is constituted by a main body 1, which has a cylindrical recess into which issue various compressed air supply and discharge circuits. The cylindrical recess houses a stator 2 constituted by a median portion 3 to which are connected two end portions 4a and 4b. The median portion 3 comprises a central, narrow zone 5 formed by a wall having a limited thickness around which is wound a radio frequency coil 6 for receiving the measurement signals.

The rotor 7 is located on the other side of said narrow wall 5. It is constituted by a spherical central core 8 and in which is formed a cylindrical cavity 9, as well as two conical rollers 10a,10b, which open slightly on moving away from the central core 8. The rollers 10a,10b are connected to the central core 8 at two opposite points thereof and extend along the axis $A_n$, which corresponds to the nutation axis of the rotor 7 and which also coincides with the axis of the cylindrical cavity 9.

The ends of the rollers 10 opposite to the rotor 7 are provided with notches 11, which define and separate the drive blades and which succeed one another along two circumferences about the nutation axis $A_n$.

Each of the end portions comprises an excrescence or bulge 12 extending to the interior of the median portion 3 in the direction of the rotor 7 and which is terminated by a conical bearing surface 13 on which a respective roller 10a,10b rolls by a conical rolling surface 23a or 23b.

The bearing surfaces 13 are defined by cones of common axis $A_f$ or fixed axis forming with the nutation axis $A_n$ a precession angle $\theta_2$ of 30.56°. The not shown angles $\theta_1$ formed by the fixed axis $A_f$ of the magnetic field direction is 54.74°. The half-cone angle of the cones of rollers 10 is 11.37° in the case of a $\omega_2/\omega_1$ ratio of 5/3. The rotor can then roll without sliding.

Figure 4:
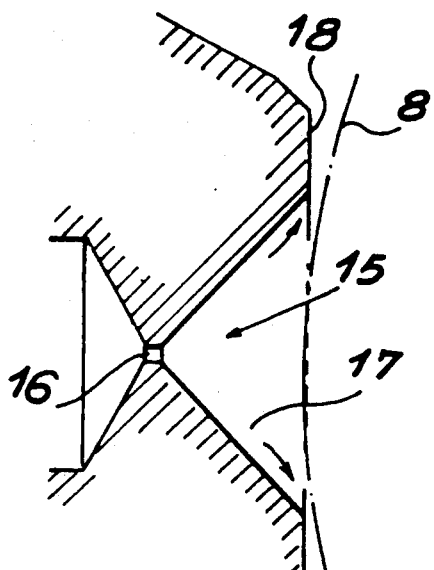
FIG. 4 a larger-scale view of a blowing orifice along line IV—IV of FIG. 1.

Compressed air supply circuits extend in the main body 1 and the end portions 4 passing through the median portion 3. In each end portion 4, said circuits has a supply pipe 14 along the axis $A_f$, which issues on a nozzle 15. The nozzle 15, shown in FIG. 4, comprises an orifice 16 and a conical chamber 17, which widens in the direction of the central core 8 and issues infront of the same so as to form an aerodynamic abuttment with a good lift. Thus, around the conical chamber 17, the excrescences 12 are provided with a stop fact 18 defined in such a way that when the stator 2 is assembled, there is only a very small clearance between the central core 8 and the two stop faces 18.

Figure 2:
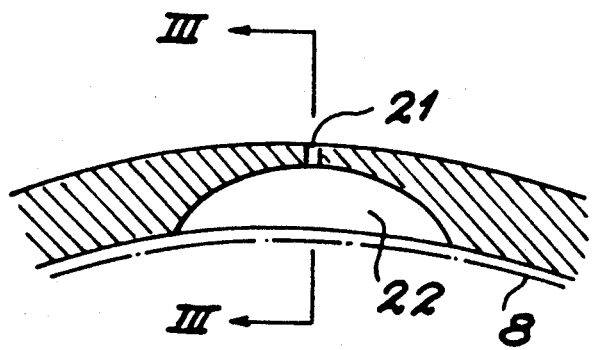
FIG. 2 a larger-scale view of a blowing orifice along line II—II of FIG. 1.
Figure 3:
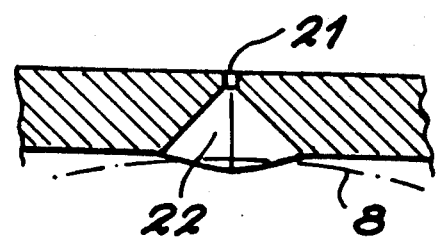
FIG. 3 a section along III—III of FIG. 2.

A second supply circuit 20 issues from the main body 1 in to the annular space surrounding the narrow zone wall 5. At the longitudinal mid-distance and in front of the centre of the central core 8, said wall has nozzles 19 distributed along a circumference so as to form an annular bearing. As shown in FIG. 2 and 3, the nozzles 19 are constituted by an orifice 21, which issues into a widened chamber 22 infront of the central core 8, whose section is triangular with a smaller opening in the longitudinal direction of the stator 2, but which opens more in the circumferential direction with a circular arc contour.

Figure 7:
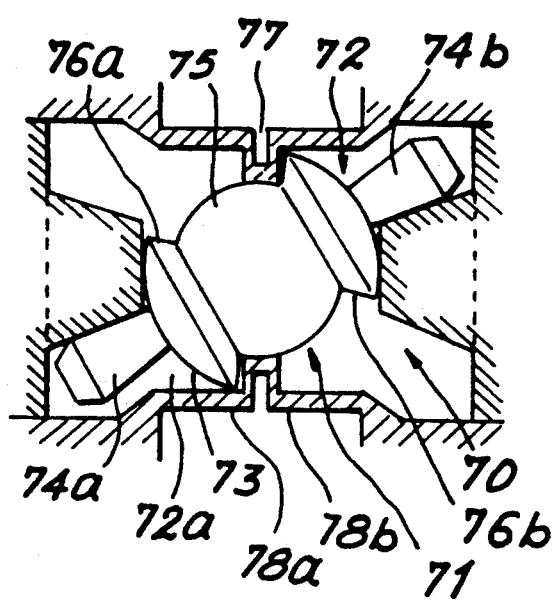

In this arrangement where there are two separate aerodynamic bearings makes it possible to use central cores with a more complicated shape like that shown in FIG. 7, where the rotor 7 comprises a central core 71, constituted by two spherical cups 72a,72b, on whose outer spherical surface 73a,73b are provided rollers 74a, 74b, as well as a truncated sphere 72 connected to the cup 72a,72b by a conical coupling 76a, 76b. The spherical surfaces of the central core 71 are centred at the same point, so that the rotations of the rotor 70 always bring the external surface 73 of the spherical cup 72 infront of one of the nozzles 15 located on the end portions 4, whilst the surface of the truncated sphere 75 remains infront of the nozzles 19 distributed over the circumference of the wall of the narrow zone 5. The latter is then modified compared with FIG. 1 so as to have a central ring 77 intermediate the two larger diameter, extending cylindrical portions 78a,78b. The nozzles 19 are placed on the ring 77. It is thus possible to reduce the stresses to which the rotor is exposed as a result of the movement and which normally limit the rotation speed which can be reached.

The pressure in the cavity swept by the ends of the rotor is reduced to less than 1/100 bar by a suitable pumping system. This leads to a reduction in the aerodynamic drag, which would otherwise considerably limit the rotation speed.

The dimensioning of the bearings is governed by the gas flow laws. As the space in which the rotor 7 rotates is at low pressure, the conditions are purely supersonic and the forces of inertia predominate over the viscosity forces. In order to obtain a good stability of the bearings, the inventor recommends that the pressure exerted on the rotor 7 at the bearings is equal to ¼ of the pressure in the supply circuit. The chamber 17 and 22 are then dimensioned in such a way that the gas flow surface between the stator 2 and the rotor 7 (the latter being assumed as perfectly centred) is four times larger than the cross-section of the respective orifices 16 and 21. In addition, the chambers 17 and 22 are at least 3 times deeper than the diameters of the respective orifices 16 and 21 in order to confine the shock wave there.

Figure 5:
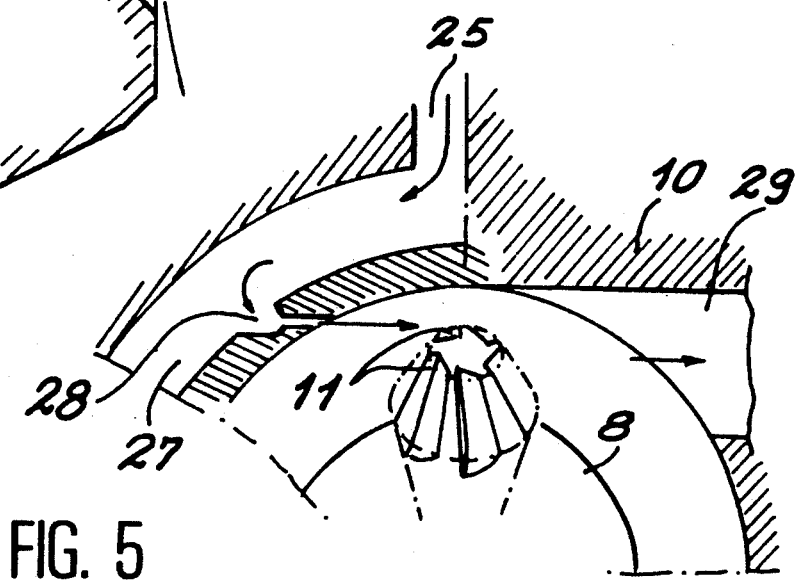
FIG. 5 viewed from the side, the rotor drive system.

FIGS. 1 and 5 show that the driving of the rotor 7 by means of the notches 11 takes place with the aid of another gas supply circuit constituted by supply pipes 25 and discharge pipes 26 in the main body 1, which are parallel and adjacent to one another. There are two supply pipes 25, one for each roller 10. Each of them terminates with an annular portion 27 around the median portion 3 of the stator 2 and which communicates with the interior of the stator 2 by means of three blowing orifices 28 angularly spaced by 120°. The correct balancing of the rotor 7 makes it necessary to always exert the same drive on each of the rollers 10a,10b, which means that the blowing orifices 28 on the side of roller 10b are angularly displaced by 60° compared with those on the side of the roller 10a.

The diameter of the blowing orifices 28 is determined in such a way that the shock waves of the three jets which they create develop as close as possible (or towards the interior) of the pumping orifices 29, which are made in the median portion 3, substantially in front of the blowing orifices 28, in order to collect and discharge the gases blown on the notches 11 and in the bearings by means of the discharge pipes 26. A pumping system, connected to the outer end of the discharge pipes 26 leads to the formation of a vacuum or low pressure in the stator 2.

Not specified annular joints obviously ensure the necessary sealing between the different assembled portions and the different pipes.

The materials from which the rotor 7 and the stator 2 are made must not conduct electricity and must be sufficiently strong. Therefore they are normally made from a ceramic material. The surfaces of the rotor 7 used for the rolling or contact with a gas bearing are covered with graphite or some other solid lubricant, which makes it possible to protect the rotor 7 against instability, which generates shocks, at the start of operation.

The bearing surfaces 13 have circumferential groups 50 for the outflow of the gases which might have appeared between the conical surfaces rolling on one another so as to form continuous layers.

The ideal geometrical characteristics of the rotor 7 are those for which the combined nutation and precession movement to which it is exposed corresponds to a natural gyroscopic movement of the rotor 7, where rolling theoretically produces no stresses. However, in practise, it is necessary to leave a slight unbalance so as to be certain of maintaining a contact force between the rollers 10 on the bearing surfaces 13.

Figure 6:
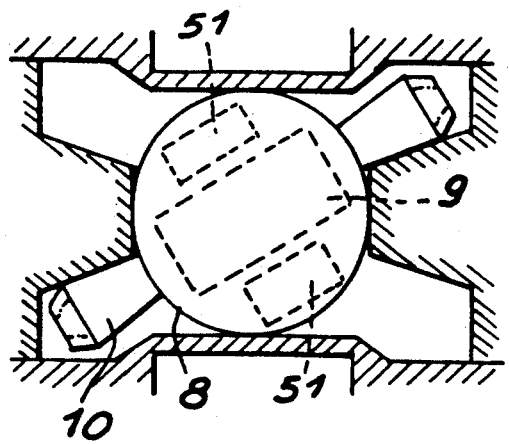
FIG. 6 and 7 two rotor constructions.

As the mechanical stresses at the root of the rollers 10 can then easily be very high, the central core 8 can be peripherally recessed in the manner shown in FIG. 7 or, as shown in FIG. 6, it is possible to place recesses 51 symmetrically around the cavity 9 and in the form of cylinders, whose axes are parallel to the nutation axis $A_n$.

Figure 8:
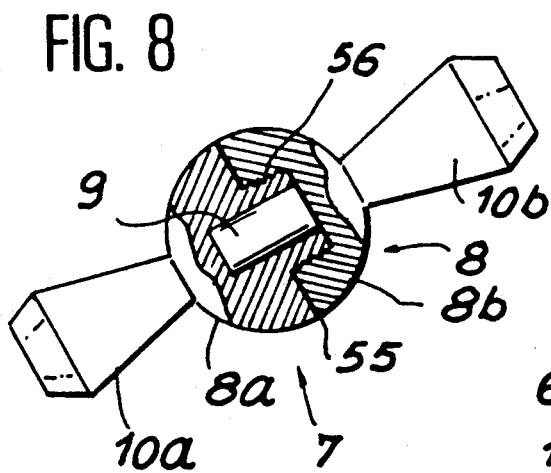
FIG. 8 a specific possibility of manufacturing the rotor with its cavity.

FIG. 8 shows in greater detail a rotor 7 from its manufacturing standpoint. The central core 8 is formed from two hemispheres 8a and 8b, which are joined in a joining plane 55 orthogonal to the nutation axis $A_n$ and mid-distance of the rollers 10.

One hemisphere 8a is provided with a central cylindrical sleeve 56 surrounding the cavity 9 and whose outer periphery is threaded. The rotor 7 is assembled by screwing the other hemisphere 8b on to the central cylindrical sleeve 56 until the planar faces of the hemispheres 8a and 8b touch at the joining plane 55.

The exterior of the rotor 7 is maintained following the initial assembly in order to obtain a perfectly smooth surface with a geometrical symmetry.

Figure 9:
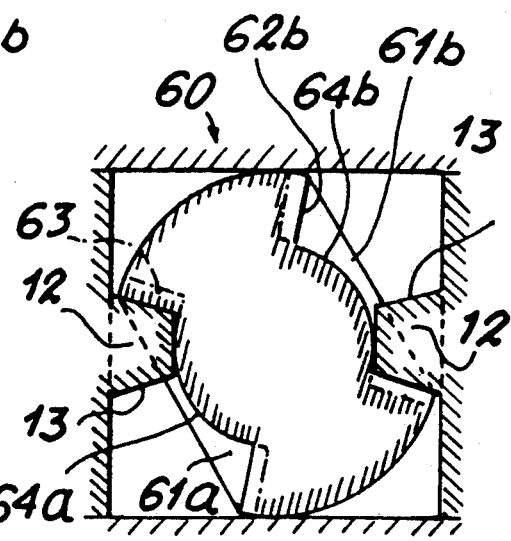
FIG. 9 another turbine design.

FIG. 9 shows another turbine construction. The rotor 60 consists solely of a spherical central core provided with two diametrically opposite concavities 61a,61b. These concavities are in each case defined by a conical surface 62a or 62b centred on the nutation axis $A_n$ and by a spherical cup-shaped bottom 64a,64b making it possible to maintain a thrust bearing between the excescences 12. Each conical surface 62 rolls on a rolling surface 13. This hypocloidal turbine is subject to precession speed limitations as a function of the nutation speed, otherwise there will be a deterioration in the adhesion of the bearing surfaces. It is also necessary to drive the rotor 6 by having notches 63 on part of the width of the conical surfaces 62. The entrainment and discharge of the gases can only be ensured with greater difficulty in this case. Therefore preference is given to the rotor 7 with rollers 10.

Fundamentally the stator 2 is not modified compared with the preceding embodiments, except with respect to the entrainment gas supply, which passes through the excrescences 12 and issues through not shown orifices on to the rolling surfaces 13.

Other equivalent constructions are possible without leaving the scope of the invention. The turbine of FIG. 1 has a rotor, in which the ratio between the rotational nutation and precession speeds is equal to 5/3. The description of the theoretical conditions preceding the detailed description of this turbine show that other choices are possible and the determination of the novel geometrical and mechanical conditions is only a routine matter for the Expert.

The cavity containing the sample can have any shape of revolution about the nutation axis $A_n$. When an analysis of a powder sample has been decided, it is advisable to rotate the rotor about the longitudinal axis and then the transverse axis, outside the stator in order to obtain a homogeneous compression in the cavity.

I claim:

1. In a turbine for holding samples to be analyzed by nuclear magnetic resonance wherein the turbine comprises a stator, a rotor for holding the samples, said rotor being provided with driving means to be engaged by a driving gas, said rotor being also supported on gas bearings in the stator, and gas supply means for supplying the gas bearings and the rotor driving gas, the improvement wherein the rotor comprises a central core provided with a cavity for containing the sample to be analyzed and two generally conical coaxial rolling surfaces, there being one of said rolling surfaces on each side of the core, the stator comprising two generally conical bearing surfaces defining coaxial cones whose axis forms an acute angle with the axis of the conical coaxial rolling surfaces on the rotor, the rotor core having a surface constituted by a spherical portion in front of each gas bearing.

2. A turbine according to claim 1, characterized in that the rotor comprises two extending conical rollers, there being one roller on each side of the core.

3. A turbine according to claim 1, characterized in that the rotor is provided with two coaxial concavities, one on each side of the core, said concavities defining the rolling surfaces.

4. A turbine according to claim 2, characterized in that the bearings comprise an annular bearing constituted by blowing nozzles distributed over a circumference of the stator between the conical bearing surfaces on the stator and a bearing constituted by two blowing nozzles, each positioned along the axis of the conical bearing surfaces on the stator.

5. A turbine according to claim 4, characterized in that the core is constituted by two spherical cups each located in front of one of the blowing nozzles of the conical bearing surfaces on the stator and to each of which is connected a conical roller, as well as a truncated sphere joining the two spherical cups, said truncated sphere having a smaller diameter than said spherical cups and being positioned in front of the annular bearing.

6. A turbine according to claim 1, characterized in that the central core is at least partially spherical.

7. A turbine according to claim 1, characterized in that the cavity for containing the sample is a volume of revolution, whose axis coincides with the axis of the conical rolling surfaces on the rotor.

8. A turbine according to claim 6, characterized in that the core contains said samples symmetrically positioned around the sample cavity.

9. A turbine according to claim 2, characterized in that notches are located at the ends of the conical rollers opposite to the core.

10. A turbine according to claim 1, characterized in that the interior of the stator is under a vacuum.

* * * * *